United States Patent
Suzuki et al.

(10) Patent No.: US 7,754,974 B2
(45) Date of Patent: Jul. 13, 2010

(54) METAL-CORE SUBSTRATE AND APPARATUS UTILIZING THE SAME

(75) Inventors: Masataka Suzuki, Shizuoka (JP); Kenji Hayakawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 902 days.

(21) Appl. No.: 11/372,104

(22) Filed: Mar. 10, 2006

(65) Prior Publication Data
US 2006/0203455 A1   Sep. 14, 2006

(30) Foreign Application Priority Data
Mar. 11, 2005   (JP) .............................. 2005-068309

(51) Int. Cl.
*H05K 1/00*   (2006.01)
(52) U.S. Cl. .................................... 174/252
(58) Field of Classification Search .................. 174/252
See application file for complete search history.

(56) References Cited

U.S. PATENT DOCUMENTS 5,724,233 A * 3/1998 Honda et al. ................. 361/813
6,580,159 B1 * 6/2003 Fusaro et al. ................ 257/668
6,605,866 B1 * 8/2003 Crowley et al. ............. 257/692

FOREIGN PATENT DOCUMENTS

JP    2003-101177    4/2003
JP    2004-303576    10/2004

* cited by examiner

*Primary Examiner*—Jeremy C Norris
(74) *Attorney, Agent, or Firm*—Kratz, Quintos & Hanson, LLP

(57) ABSTRACT

The present invention is to provide a metal-core substrate without mounting large size terminals and connectors. Hence, the metal-core substrate can be smaller and thinner. A metal-core substrate includes a metal plate, an insulating layer formed on a surface of the metal plate and a circuit pattern formed on a surface of the insulating layer, wherein a part of said metal plate is exposed to outside of the insulating layer and is utilized as connector terminals. The metal plate has a heat sink plate to heat sink a heat-generating device mounted on the metal-core substrate and connector terminal plates disposed separately from the heat sink plate and utilized for the connector terminals. The heat-generating device and a driving part thereof each are disposed on a different surface of the metal-core substrate.

4 Claims, 6 Drawing Sheets

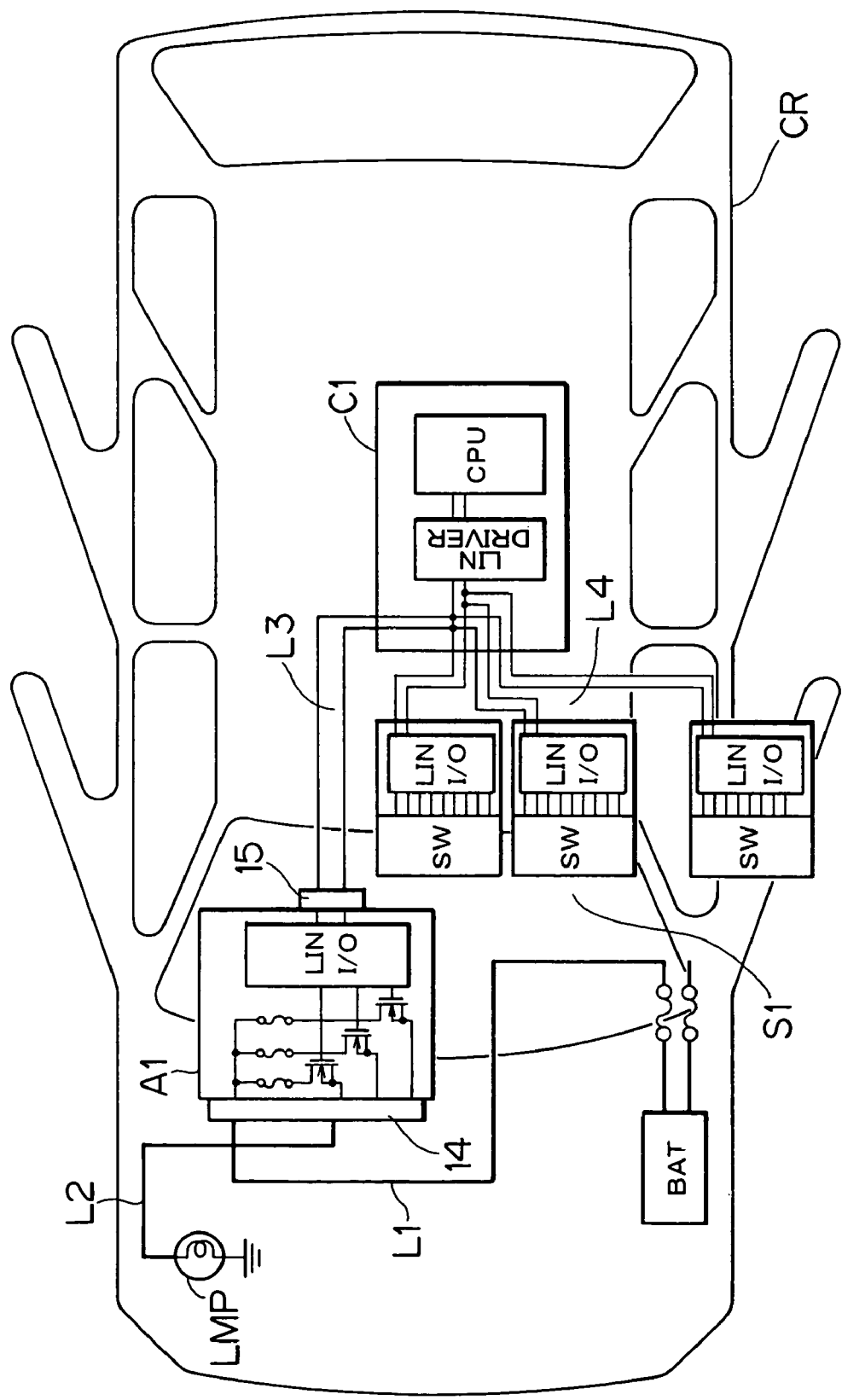
F I G. 7

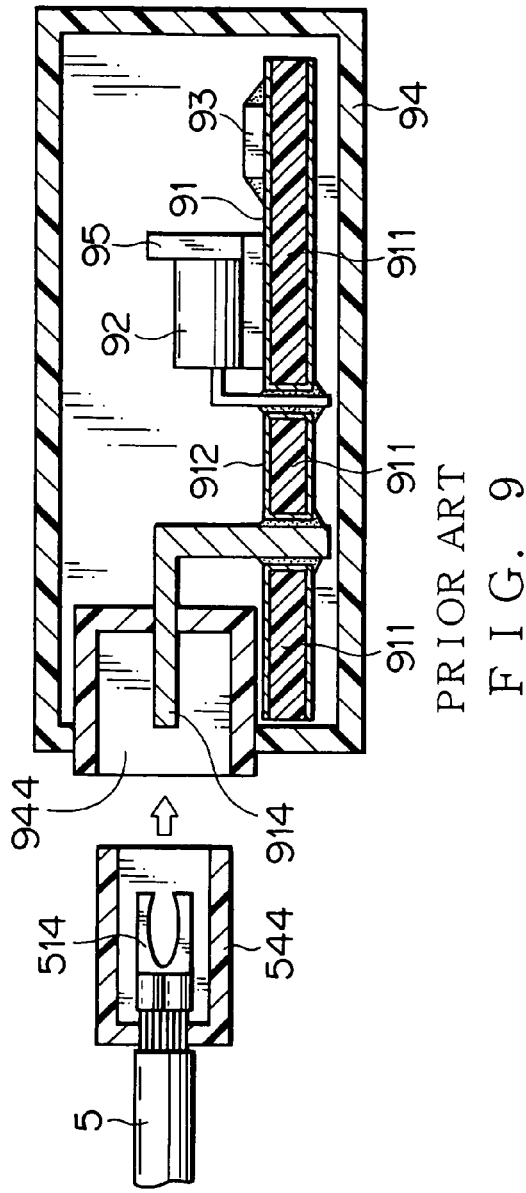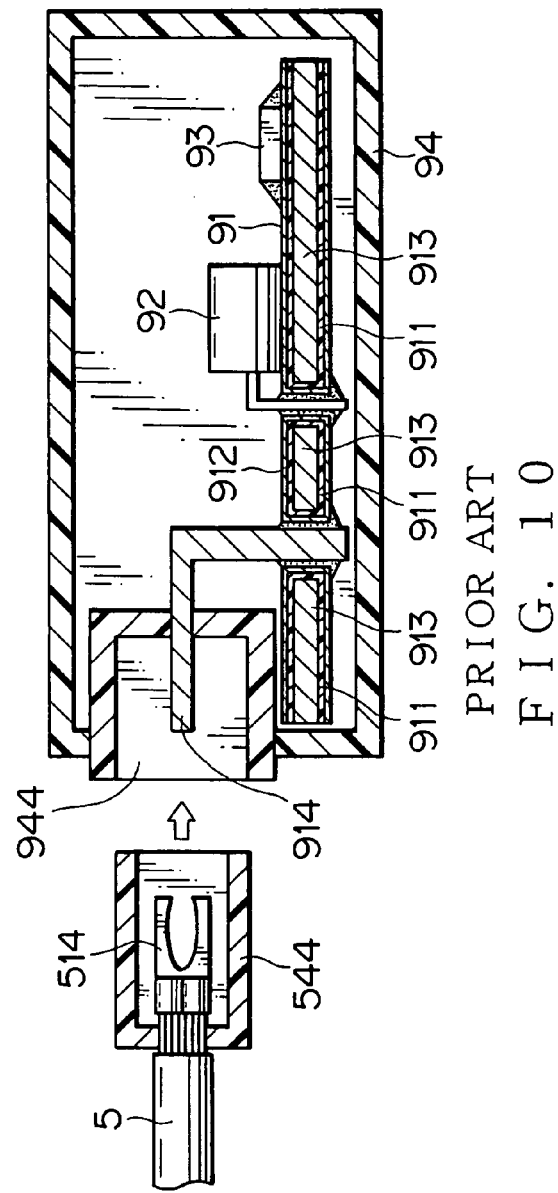

US 7,754,974 B2

METAL-CORE SUBSTRATE AND APPARATUS UTILIZING THE SAME

BACKGROUND OF THE INVENTION

1. Filed of the Invention

The present invention relates to a metal-core substrate having an insulating layer thereon and a circuit pattern on the insulating layer and relates to an apparatus utilizing the same.

2. Description of the Related Art

A vehicle has several loads such as lamps and motors. In order to control these loads, heat-generating devices such as FET (Field-Effect Transistor) are utilized and it is necessary to heat sink these devices. In order to solve the problem, the heat-generating devices and heat sink members are mounted together to a substrate or a metal plate is placed inside a substrate as described in JP,2003-101177,A.

FIG. 9 shows a conventional substrate having a heat sink member. FIG. 10 shows a conventional substrate having a metal plate for heat sink.

As shown in FIG. 9, a conductive circuit pattern 912 is formed on an insulating substrate 911. The substrate 911 has a heat-generating device 92 such as FET to control the loads of a vehicle, a driving part 93 to drive the heat-generating device 92, a heat sink member 95, for example a fin, to heat sink the heat-generating device 92, and a male connector 944 receiving a plurality of male terminals 914. A battery (not shown) supplies an electric power to the loads (not shown) through female terminals 514, the male terminals 514, and the FET. The substrate 911 having these parts is received in a box-shaped case 94.

In FIG. 9, the female connector 544 has the plurality of female terminals 514 connected to electric wires 5 and is fitted into the male connector 944 in a direction shown by an arrow. The electric wires 5 are connected to the loads such as battery, lamps and motors. Thus, the female terminals 514 provide the electric power to the male terminals 914 and receive the electric power to supply to the loads from switching controls such as the FET.

FIG. 10 shows a conventional substrate 91 having a metal plate 913 to increase a mechanical strength thereof and to heat sink a heat-generating device 92 without a heat sink member 95 such as a fin. The metal-core substrate 91 has the metal plate 913 and an insulating layer 911 covering the metal plate 913. A circuit pattern 912 is formed on the insulting layer 911. The elimination of the heat sink member reduces a number of parts and provides a space so that the metal-core substrate can be minimized. The other structures of FIG. 10 are the same as those of FIG. 9 and the explanations are omitted.

Recently, small and thin sized substrates are required. JP,2004-303576,A discloses that male terminals 914 are formed on a substrate as a circuit pattern. However, since the male terminals 914 connected to a battery and loads are subjected to a high current of order of amperes, it is necessary to have a certain level of thickness. Accordingly, the male terminals 914 are not suitable to be formed as the circuit pattern. The large size of the male terminals 914 and connectors 944 receiving the male terminals 914 prevent the substrate from being smaller and thinner.

SUMMARY OF THE INVENTION

The present invention is to provide a metal-core substrate which does not include large connector terminals and connectors, and can be smaller and thinner. The present invention is to provide an in-vehicle system having the metal-core substrate.

According to a first aspect of the present invention, a metal-core substrate includes a metal plate; an insulating layer formed on a surface of the metal plate; and a circuit pattern formed on a surface of the insulating layer, wherein a part of the metal plate is exposed to outside of the insulating layer and is utilized as connector terminals.

Preferably, the metal plate has a heat sink plate to heat sink a heat-generating device mounted on the metal-core substrate and connector terminal plates disposed separately from the heat sink plate and utilized for the connector terminals.

Preferably, the heat-generating device and a driving part thereof each are disposed on a different surface of the metal-core substrate.

Preferably, the connector terminal plates are disposed on extensions of the heat sink plate and are formed with a same material and have a same thickness as the heat sink plate.

Preferably, the metal-core substrate is disposed in an in-vehicle system, wherein the metal-core substrate has integrated heat-generating devices to control in-vehicle loads by controlling an electric power of a battery through the connector terminal plates, and the metal-core substrate is received in a case.

BRIEF DESCRIPTION OF THE DRAWINGS

FIG. 7 shows an exemplary in-vehicle system having a heat sink unit utilizing the metal-core substrate of FIG. 1;

FIG. 9 shows a conventional substrate having a heat sink member; and

FIG. 10 shows a conventional substrate having a metal plate for heat sink.

DETAILED DESCRIPTION OF THE PREFERRED EMBODIMENTS

Figure 1:
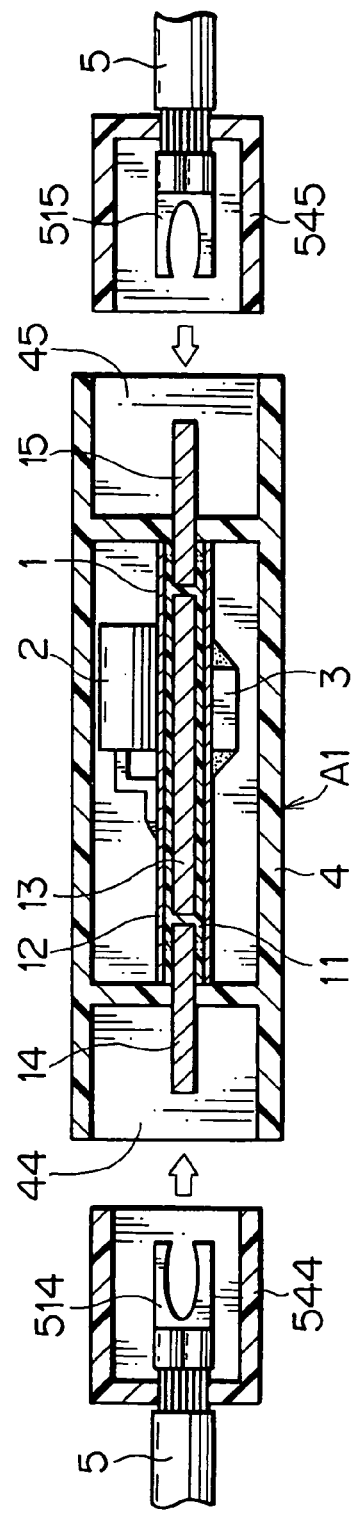
FIG. 1 shows an embodiment of a metal-core substrate of the present invention.

As shown in FIG. 1, a metal-core substrate 1 of an embodiment has a heat sink plate (metal plate) 13 and connector terminal plates (metal plate) 14, 15, an insulating layer 11 formed on surfaces of the metal plates 13, 14, 15, and a circuit pattern 12 formed on the insulating layer 11.

The heat sink plate 13 and the connector terminal plates 14, 15 are formed with a same material, for example aluminum or copper, and has a same thickness. They have high heat-resistance and high heat sink. The connector terminal plates 14, 15 are disposed at extensions of the heat sink plate 13. Thus, both the connector terminals 14, 15 and the heat sink plate 13 can be formed integrally and cut into each plate thereafter. This formation reduces manufacturing cost and processes. The heat sink plate 13 acts as heat sink for a heat generating device 2, such as FET, mounted on the metal-core substrate 1 and strengthens the metal-core substrate 1.

Figure 2:
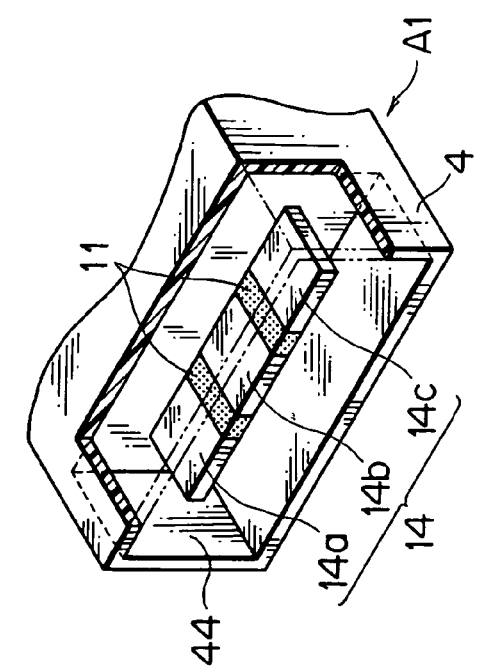
FIG. 2 is an essential sectional view of the metal-core substrate of FIG. 1.

Although the metal plates 13, 14, 15 are covered with the insulating layer 11, a part of the connector terminal plates 14, 15 is exposed outside as external connector terminals. Each of the connector terminal plates 14, 15 is separated into a plurality of terminals 14a, 14b, 14c as shown in FIG. 2. For example, the connector terminal plates 14a, 14b, 14c each are connected to a battery, lamps, motors through each female terminal and electric wire, respectively. The circuit pattern 12 is formed on one side or both sides of the metal-core substrate 1 on the insulating layer 11. As shown in FIG. 2, the insulating layers 11 are formed between the connector terminal plates 14a, 14b, 14c to increase the thereof strength and prevent leakage.

The heat-generating device 2 such as FET to control loads such as the lamps and motors, and a driving part 3 to drive the devices 2 are mounted on the circuit pattern 12. The heat-generating device 2 and the driving part 3 each are mounted on a different side or the same side of the metal-core substrate 1. A heat sink member such as fin for the heat-generating device 2, a large connector terminal for use of a high current, and a connector to receive the terminal are not mounted on the circuit pattern 12.

The metal-core substrate 1 having the heat-generating device 2 and the driving part 3 is received in a case 4 of a rectangular shape made of a synthetic resin. The case 4 has male connector portions 44, 45 at end portions thereof. As shown in FIG. 2, the male connector portions 44, 45 each has a space for a female connector 544 to be inserted. The plurality of the connector terminal plates 14a, 14b, 14c are protruded in the each male connector portion 44. The metal-core substrate 1 having the heat-generating device 2 and the driving part 3, and received in the case 4 is utilized for a heat sink unit A1 for a vehicle.

Figure 3:
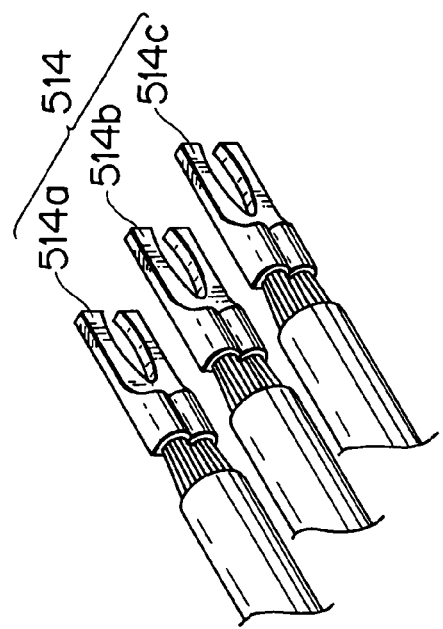
FIG. 3 shows an exemplary arrangement of female terminals to be fitted into male terminals of the metal-core substrate of FIG. 1.

Female connectors 544, 545 are fitted into the male connector portions 44, 45 in directions of arrows in FIG. 1. The female connectors 544, 545 have female terminals 514, 515 connected with electric wires 5. Each female terminal 514 or 515 is formed with a plurality of female terminals 514a, 514b, 514c disposed vertically as shown in FIG. 3.

For example, the female terminals 514a, 514b, 514c are connected to the battery, lamps, motors through the electric wires 5, respectively. The female terminal 514 supplies an electric power of the battery to the male terminal 14 and receives the electric power from the male terminal 14 to supply in-vehicle loads such as lamps and motors after the electric power is switched with FET. The female terminals 514, 515 can be utilized for receiving and transmitting control signals between control units.

The metal plates can have a certain amount of thickness and area so that the metal plates are utilized for a large size terminal for a high current. Then, it is not necessary to use a large size terminal and a connector to receive the terminal so that the heat sink unit can be smaller and thinner.

The metal plates include the heat sink plate 13 and the connector terminal plates 14, 15 for the external connector terminals so that the metal-core substrate 1 performs a function of a large size terminal-less, connector-less, and heat sink member-less with the small size and thickness. The reduction of the number of the parts simplifies the substrate and reduces the cost thereof. The mounting of the heat-generating device 2 and the driving part 3 onto the both sides of the metal-core substrate 1 can reduce the area of the substrate and make the substrate further smaller.

In the above embodiment, the both end portions of the substrate are utilized for the connector terminal plates 14, 15. The only one end portion can be utilized. The connector terminal plates 14, 15 both are not necessary to be used for the male terminals of high current. The connector terminal plates 14 and 15 can be utilized for the high current terminal and a small current terminal for control signals, respectively. The heat-generating device 2 and the driving part 3 can be mounted on the one side of the substrate.

Figure 4A:
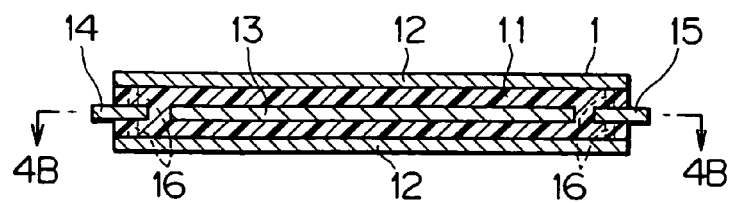
FIG. 4A is a side sectional view of a modification of the embodiment of the metal-core substrate of FIG. 1.
Figure 4B:
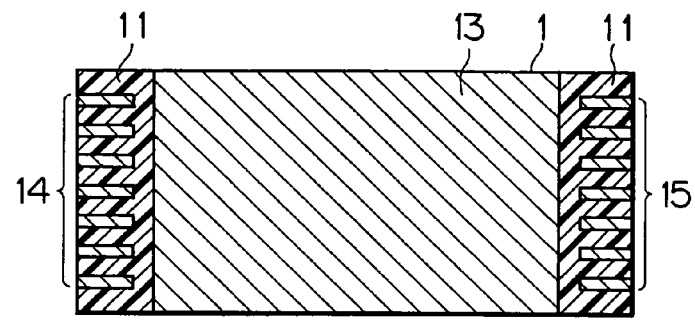
FIG. 4B is a sectional view of FIG. 4A taken along a line 4B-4B.
Figure 6:
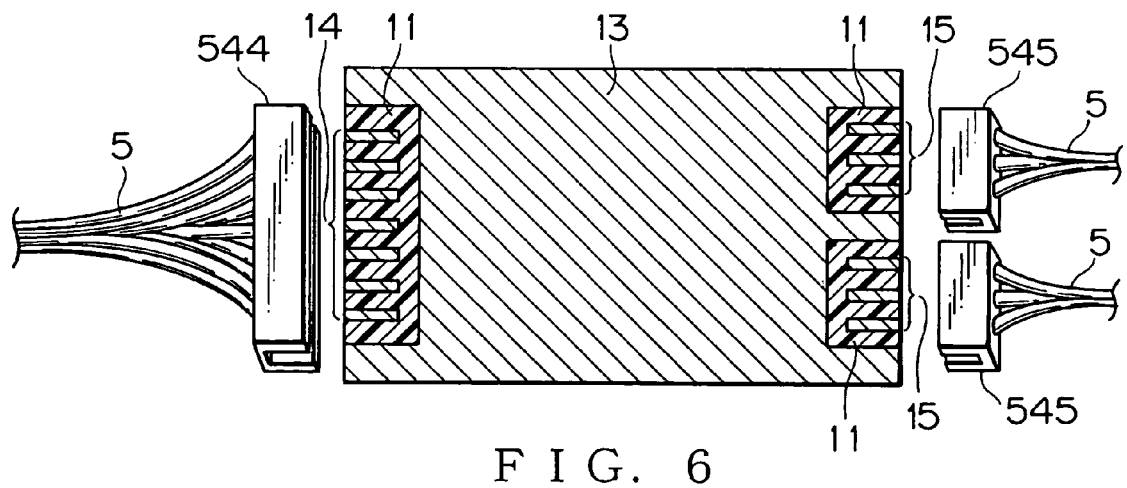
FIG. 6 shows a still further modification of the embodiment of the metal-core substrate of FIG. 1.
Figure 5A:
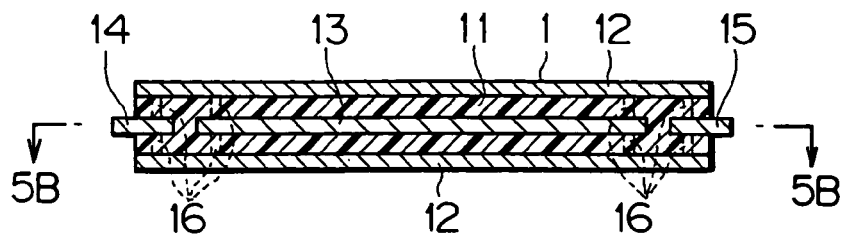
FIG. 5A is a side sectional view of another modification of the embodiment of the metal-core substrate of FIG. 1.
Figure 5B:
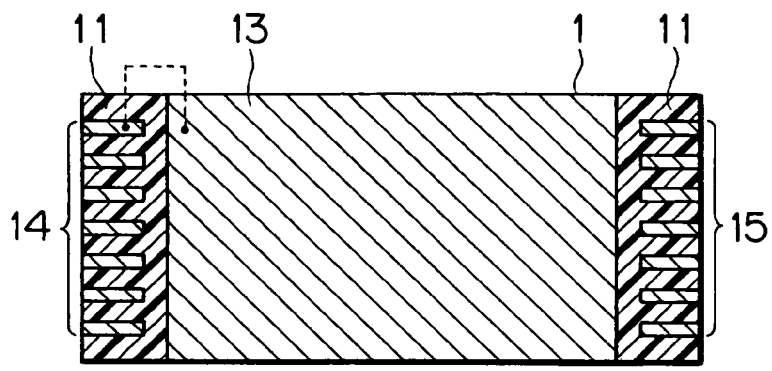
FIG. 5B is a sectional view of FIG. 5A taken along a line 5B-5B.
Figure 5C:
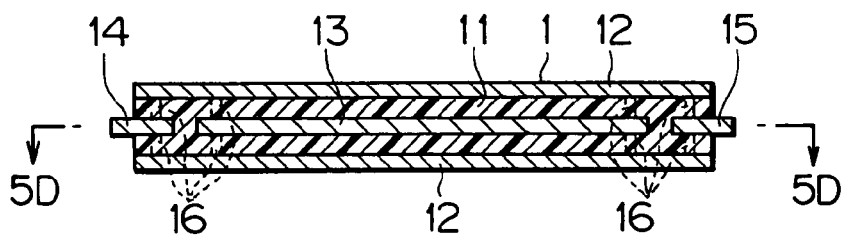
FIG. 5C is a side sectional view of a further modification of the embodiment of the metal-core substrate of FIG. 1.
Figure 5D:
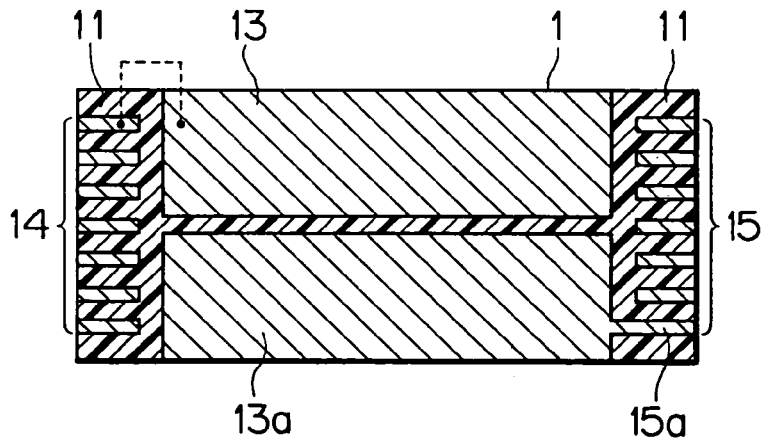
FIG. 5D is a sectional view of FIG. 5C taken along a line 5D-5D.

Some modifications of the above embodiment are shown in FIGS. 4A, 4B, 5A-5D, and 6. FIG. 4A is a side sectional view of a modification of the metal-core substrate of the embodiment of FIG. 1. FIG. 4B is a sectional view taken along a line 4B-4B of FIG. 4A. FIGS. 5A and 5C are side sectional views of another modifications of the metal-core substrate of the embodiment of FIG. 1. FIGS. 5B and 5D are sectional views taken along lines 5B-5B and 5D-5D of FIGS. 5A and 5C, respectively. FIG. 6 shows a further modification of the metal-core substrate of the embodiment of FIG. 1.

As shown in FIGS. 4A and 4B, a heat sink plate 13 and connector terminal plates 14, 15 are separated each other similarly to the embodiment of FIG. 1. The heat sink plate 13 acts only for heat sink (including reinforce of the substrate) and does not include electric function. Circuits patterns 12 and the connector terminal plates 14, 15 are electrically connected with through-holes 16. The modification has the connector terminal plates 14, 15 more than those of the embodiment shown in FIG. 1 and has insulating layers 11 at both sides of the connector terminal plates 14, 15. This structure increases the strength of the substrate. Main structure, materials and parts forming the modification are the same as those of the embodiment of FIG. 1 and the explanations are omitted.

The modifications shown in FIGS. 5A-5D each have a heat sink plate 13 and connector terminal plates 14, 15 which are electrically connected each other through through-holes 16 and circuit patterns 12. The heat sink plate 13 acts for heat sink and also for a part of the electric circuit. As shown in FIG. 5D, a heat sink plate 13a may extend to a connector terminal plate 15a. Both cases may be utilized. The heat sink plate 13 can be utilized as an electric power line or ground line. The modifications each have the connector terminal plates 14, 15 more than those of the embodiment shown in FIG. 1 and has insulating layers 11 at both sides of the connector terminal plates 14, 15. This structure increases the strength of the substrate. Main structure, materials and parts forming the modifications are the same as those of the embodiment of FIG. 1 and the explanations are omitted.

The further modification is shown in FIG. 6. A metal-core substrate has connector terminal plates 14, 15 to match input-output connectors. Insulating layers 11, a heat sink plate 13 and connector terminal plates 14, 15 are formed so as to match to a large size connector 544 or two small size connectors 545 but are not limited to this case. Main structure, materials and parts forming the modification are the same as those of the embodiment of FIG. 1 and the explanations are omitted.

An example utilizing a heat sink unit A1 having a metal-core substrate 1 in a vehicle is shown in FIG. 7. A conventional in-vehicle system is shown in FIG. 8.

Figure 8:
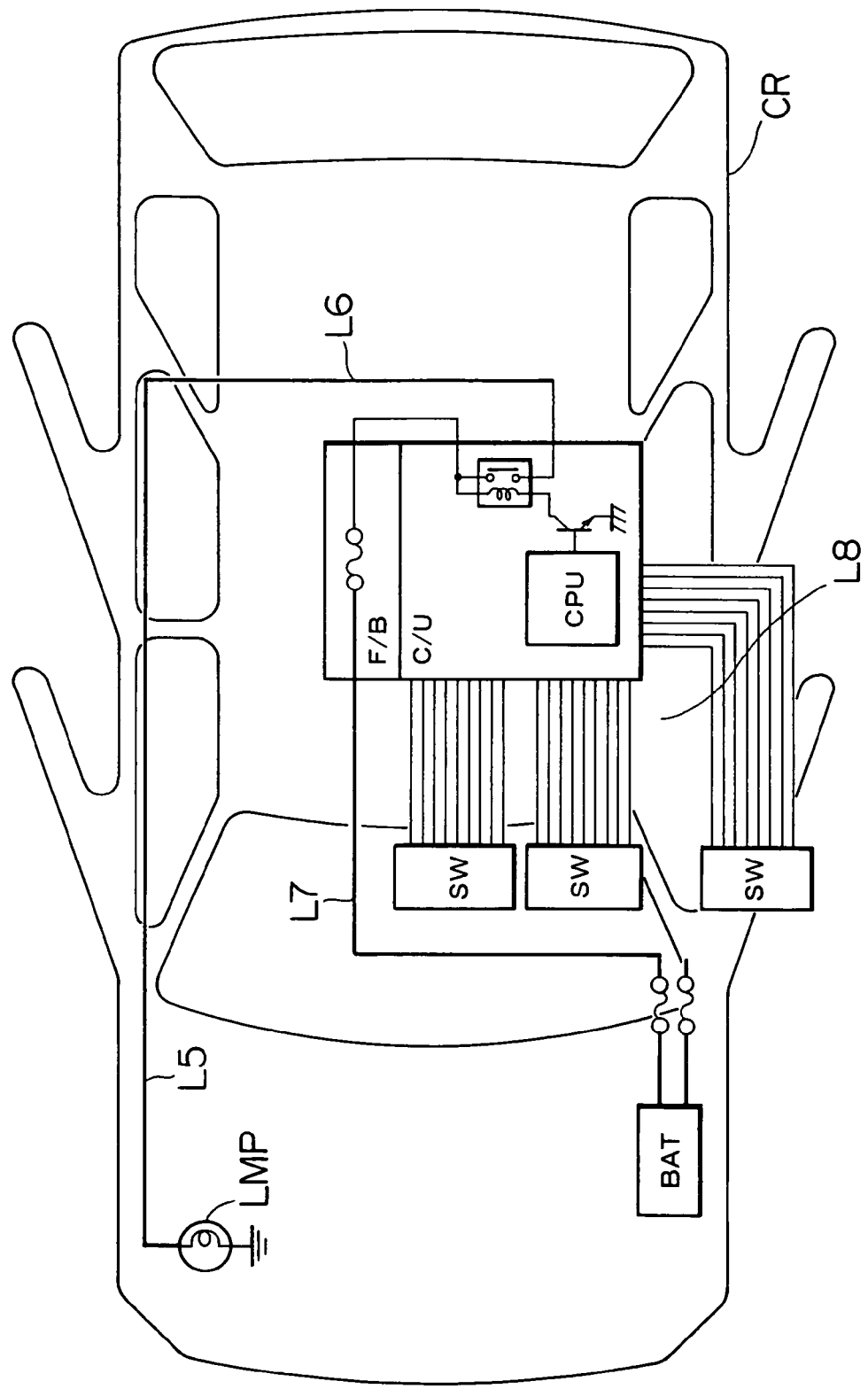
FIG. 8 shows a conventional in-vehicle system.

As shown in FIG. 8, the conventional system includes a control unit C/U and switches SW to control lamps LMP or motors in the vehicle. The control unit C/U has switching devices, such as transistors and relays, a CPU, and a fuse box F/B. Operation signals of the switches SW are transmitted to the control unit C/U through a wiring harness L8. The CPU in the control unit C/U responds to the operation signals and controls the switching devices. The CPU supplies an electric power, which is supplied from a battery BAT through a wiring harness L7, to the lamp LMP through a wiring harness L6 and turns on and off the lamp LMP.

The in-vehicle system has the switching devices operated with a current of order of amperes and the CPU operated with a current of order milliamperes so that a body of the control unit, the substrate and the wiring harness become large size. The connectors become multi-pins, large, complicated.

In an embodiment of the present invention, as shown in FIG. 7, heat-generating devices and control devices are separated. The connection of each other devices is performed with LIN (Local Interconnect Network). The in-vehicle system of the embodiment includes the heat sink unit A1, as shown in FIG. 1, receiving the metal-core substrate 1 mounted with the heat-generating devices such as FET. The heat sink unit A1 includes also an LIN interface. A control unit C1 includes a CPU and an LIN driver and is separated from the heat sink unit A1. An operation switch unit S1 to input the operation signals includes LINs and is separated from the heat sink unit A1 and the control unit C1.

The control unit C1 is connected to the heat sink unit A1 and the operation switch unit S1 through a wiring harnesses L3 and L4, respectively. The heat sink unit A1 is connected to a battery BAT and a lamp LMP through electric wires L1 and L2. The heat sink unit A1 is connected to the battery BAT and the lamp LMP, and the control unit C1 through the connector terminal plates 14 and 15, respectively.

The CPU in the control unit C1 responds to the operation signals transmitted from the switches SW through the LINs in the operation switch unit S1. The CPU transmits the switching signals to control the heat-generating devices such as FET to the heat sink unit A1 through the LIN driver in the control unit C1. The heat sink unit A1, which receives the switching signals, supplies the electric power, which is supplied from the battery BAT with the heat-generating devices through the wiring harness L1, to the in-vehicle loads such as the lamp LMP through the wiring harness L2, and controls to turn on and off the lamp LMP.

The use of the LIN makes the wiring harnesses small and simple. The heat sink unit A1 having the metal-core substrate 1 and the control unit C1 having the CPU are disposed separately so that the CPU is not affected so much with heat and pins of the CPU can be smaller. A part of the metal-core substrate 1 can be utilized for a large size male connector terminal so as that the connector is smaller and simpler. This accomplishes for the in-vehicle system to have a high freedom arrangement of units.

According to the embodiments, the metal-core substrate of the present invention does not require the large size terminals and connectors so that the metal-core substrate can be smaller and thinner. The metal-core substrate of the present invention provides the in-vehicle system without the use of the large size terminals and connectors.

What is claimed is:

1. A metal-core substrate comprising
   a metal plate having opposed surfaces;
   an insulating layer formed on both opposed surfaces of the metal plate; and
   a circuit pattern formed on a surface of the insulating layer,
   wherein the metal plate has a heat sink plate to heat sink a heat-generating device mounted on the metal core substrate and has connector terminal plates disposed separately from the heat sink plate, and
   wherein the connector terminal plates include a portion covered with the insulating layer and a part exposed outside of the insulating layer arranged to be utilized as connector terminals.

2. The metal-core substrate as claimed in claim 1, wherein said heat-generating device and a driving part for driving the same each are disposed on different opposed surfaces of the metal-core substrate.

3. The metal-core substrate as claimed in claim 2, wherein said connector terminal plates are disposed on extensions of the heat sink plate and are formed with the same material and have the same thickness as the heat sink plate.

4. An in-vehicle system having a heat sink unit, wherein said heat sink comprises the metal-core substrate, as claimed in claim 1, including integrated heat-generating devices to control in-vehicle loads by controlling an electric power of a battery through the connector terminal plates, and a case to receive the metal-core substrate.

\* \* \* \* \*